United States Patent [19]

Ichimura et al.

[11] Patent Number: 5,701,124
[45] Date of Patent: Dec. 23, 1997

[54] 1-BIT SIGNAL PROCESSING APPARATUS CAPABLE OF AMPLITUDE MODULATION AND RECORDING OR REPRODUCING APPARATUS HAVING LOADED THEREON THE SIGNAL PROCESSING APPARATUS

[75] Inventors: Gen Ichimura, Tokyo; Masayoshi Noguchi, Chiba, both of Japan

[73] Assignee: Sony Corporation, Tokyo, Japan

[21] Appl. No.: 622,291

[22] Filed: Mar. 25, 1996

[30] Foreign Application Priority Data

Mar. 31, 1995 [JP] Japan .................. PO 7-075367 U

[51] Int. Cl.$^6$ .................................................. H03M 3/02
[52] U.S. Cl. ........................................ 341/50; 341/143
[58] Field of Search ............................ 341/141, 143, 341/50, 200; 395/2.38, 2.14

[56] References Cited

U.S. PATENT DOCUMENTS

| | | |
|---|---|---|
| 5,248,971 | 9/1993 | Mandl ............................ 341/141 |
| 5,375,189 | 12/1994 | Tsutsui ........................... 395/2.38 |

FOREIGN PATENT DOCUMENTS 2270240  3/1994  United Kingdom .......... H04L 25/49

OTHER PUBLICATIONS

D. Jones et al., *Design and Analysis of Delta–Sigma Based IIR Filters*, IEEE Transactions on Circuits and Systems II: Analog and Digital Signal Processing, vol. 40, No. 4, pp. 233–240 (1993).

A. Lu et al., *A High-Quality Analog Oscillator Using Oversampling D/A Conversion Techniques*, IEEE Transactions on Circuits and SystemnsII: Analog and Digital Signal Processing, vol. 41, No. 7, pp. 437–443 (1994).

*Finer Audio From CDs*, Machine Design, vol. 61, No. 17, pp. 64–66 (Aug. 24, 1989).

*Primary Examiner*—Brian K. Young
*Attorney, Agent, or Firm*—Jay H. Maioli

[57] ABSTRACT

A digital signal process apparatus adapted to vary a one-bit digital signal in the amplitude direction by performing preset processing operations based upon a multi-bit coefficient generator, a coefficient generated by the coefficient generator and a one-bit digital signal, and a recording/reproducing apparatus containing the digital signal processing circuit.

15 Claims, 9 Drawing Sheets

1-BIT SIGNAL PROCESSING APPARATUS CAPABLE OF AMPLITUDE MODULATION AND RECORDING OR REPRODUCING APPARATUS HAVING LOADED THEREON THE SIGNAL PROCESSING APPARATUS

BACKGROUND

1. Field of the Invention

This invention relates to a digital signal processing method and apparatus for performing signal processing in an amplitude direction on an input signal digitized with a small number of bits, such as one bit.

2. Background of the Invention

The method of digitizing an audio signal for recording, reproduction and transmission has hitherto been practiced in a recording/reproducing apparatus; such as a compact disc (CD) or a digital audio tape (DAT), or a digital audio broadcasting, such as a satellite broadcasting. In the digital audio transmission apparatus, the sampling frequency of 48 kHz and the number of quantization bits of 16 have been prescribed as the format for digitization.

In the conventional digital audio transmission apparatus, the number of quantization bits of the digital audio data generally prescribes the dynamic range of the demodulated audio signals. For transmitting audio signals of higher signal quality, it is necessary to increase the number of quantization bits from the current value of 16 bits to 20 or 24 bits. However, once the format has been set, the signal processing circuit is fixed and the number of quantization bits cannot be increased easily.

As a method for digitizing audio signals, a sigma-delta method ($\Sigma\Delta$ method) has been disclosed in Yoshio Yamazaki, "AD/DA Converter and Digital Filter", in the Journal of Japan Acoustic Association, vol.46, No.3 (1990), pages 251 to 257.

FIG. 1 shows the construction of a circuit for 1-bit $\Sigma\Delta$ modulation. In this figure, an input audio signal from an input terminal 61 is provided to an integrator 63 via an adder 62. A signal from the integrator 63 is supplied to a comparator 64 where it is compared to, for example, a neutral point voltage of the input audio signal, and is quantized by, for example, one bit quantization every sampling period. For the frequency of the sampling period (sampling frequency), the frequency equal to 64 or 128 times the conventional sampling frequency of 48 kHz or 44.1 kHz is employed. The number of quantization bits may be 2 or 4 bits.

The quantized data is supplied to a one-sample delay circuit 65 where it is delayed by one sample period. The delayed data is converted by, for example, a one-bit D/A converter 66 into analog signals which are supplied to the adder 62 so as to be added to the input audio signal entering the input terminal 61. A quantized data outputted from the comparator 64 is outputted at an output terminal 67. Thus, with one-bit $\Sigma\Delta$ modulation, carried out by a $\Sigma\Delta$ modulation circuit, audio signals of a high dynamic range may be produced even with a small number of bits, such as one bit, by employing a sufficiently high sampling frequency. On the other hand, broad transmission frequency ranges may be achieved. In addition, the $\Sigma\Delta$ modulation circuit is suited to integration and capable of achieving high precision in A/D conversion, so that it is frequently employed in the inside of an A/D converter. The $\Sigma\Delta$ modulated signals may be passed through an analog low-pass filter of a simplified design for restoration to analog audio signals. By exploiting these features, the $\Sigma\Delta$ modulation circuit can be applied to a recorder or to data transmission handling high-quality data.

Meanwhile, the signal processing in the amplitude direction, including signal attenuation, such as fading, equalizing, filtering, cross-fading or mixing, which can be realized in a digital audio transmission apparatus handling digital signals of a multi-bit format, such as 16-bit format, referred to hereinafter as a multi-bit digital audio transmission apparatus, cannot be realized without considerable difficulties with a digital audio transmission apparatus employing the $\Sigma\Delta$ modulation circuit if characteristics proper to the processing, such as broad transmission range or high dynamic range, are to be manifested satisfactorily.

The fading, for example, includes fade-out of gradually lowering the reproduced signal level with the lapse of time, or fade-in of gradually increasing the audio signal level gradually from the zero level. The fading is a customary signal processing technique in the amplitude direction of the audio signals.

Referring to FIG. 2, the fading to be carried out by the above-mentioned multi-bit digital audio transmission apparatus is explained. In FIG. 2, a multi-bit digital audio signal, such as a 16-bit signal, supplied to an input terminal 71, is outputted via a multiplier 72 at an output terminal 73. If a control signal specifying the fading start timing or fading speed is supplied to a control input terminal 74, the control signal is supplied to a control circuit 75 where an arbitrary fading signal is generated. As the fading signal is supplied to a coefficient generator 76, a coefficient of gradually lowering the audio signal level to a zero level is produced and supplied to the multiplier 72.

When the digital audio signal is supplied to the digital signal input terminal 71, there is generated and outputted at the output terminal 73 an audio signal which is gradually lowered at a designated speed to a zero level as from a timing specified by a control signal by way of performing the fade-out described above. The fade-in of gradually increasing the audio signal level from the zero level may be performed by reversing the sequence of generation of coefficients generated by the coefficient generator.

However, such processing cannot be achieved with the $\Sigma\Delta$ modulated digital audio signal. That is, since the $\Sigma\Delta$ modulated digital signal, such as a 1-bit signal, has the amplitude information represented as a 1-bit pattern on the time axis, it has been difficult to multiply the signal as conventionally by the multiplier 72 by way of performing amplitude processing operations.

OBJECT AND SUMMARY OF THE INVENTION

It is therefore an object of the present invention to provide a digital signal processing method and apparatus capable of transmitting high-quality audio signals by realizing signal processing in the amplitude direction of digital signals of a small number of bits, such as one bit, for exploiting the broad transmission range and high dynamic range proper to the digital signals of a small number of bits.

In one aspect, the present invention provides a digital signal processing apparatus including coefficient generating means for varying a multi-bit coefficient generated responsive to an actuation by a user, calculating means for performing a pre-set processing operation based upon a bit-based input digital signal and a coefficient which is a multi-bit signal generated by the coefficient generating means, and conversion means for re-quantizing the results of processing operations made up of a multi-bit signal outputted by the processing means.

In another aspect, the present invention provides a digital signal processing apparatus including input means for inputting at least two one-bit digital signals, and coefficient generating means for generating pre-set coefficients formed by multiple bits. The coefficients are associated with the one-bit digital signals entering the input means. The digital signal processing apparatus also includes a plurality of calculating means for performing pre-set processing operations based upon the one-bit digital signals entering the input means and the coefficients formed by multiple bits generated by the coefficient generating means, first addition means for adding the results of processing by the processing means, conversion means for re-quantizing the results of addition of the addition means into a one-bit digital signal, and second addition means for adding the results of addition from the addition means and the one-bit digital signal produced by the conversion means.

In yet another aspect, the present invention provides a recording apparatus for recording a one-bit digital signal on a recording medium. The recording apparatus includes coefficient generating means for varying a multi-bit coefficient generated responsive to an actuation by a user, calculating means for performing a pre-set processing operation based upon a bit-based input digital signal and a coefficient formed by a multi-bit signal generated by the coefficient generating means, conversion means for re-quantizing the processing results formed by multiple bits outputted by the processing means into the one-bit digital signal, and recording means for recording the one-bit digital signal re-quantized by the conversion means on a recording medium.

In still another aspect, the present invention provides a reproducing apparatus for reproducing a one-bit digital signal from a recording medium. The reproducing apparatus includes coefficient generating means for varying a multi-bit coefficient generated responsive to an actuation by a user, calculating means for performing pre-set processing operations based upon a coefficient made up of a one-bit digital signal reproduced from the recording medium and the multi-bit signal generated by the coefficient generating means, conversion means for re-quantizing the processing results made up of a multiple signal outputted by the processing means into the one-bit digital signal, and output means for converting the one-bit digital signal re-quantized by the processing means into an analog signal and outputting the produced analog signal.

Since the processing operations are performed in such a manner that amplitude components of small-number bit input digital signals are increased or decreased in a controlled manner, responsive to the type of signal processing in the amplitude direction, such as attenuation or mixing, and the processed result is re-converted into small-number bit digital signals, it becomes possible to manifest the characteristics proper for a small-number bit digital signal satisfactorily.

With the digital signal processing apparatus according to the present invention, the calculating process performs processing operations on input signals made up of a small number of bits, while the small bit number conversion process converts the output signal of the calculating process into a signal of a smaller number of bits, the digital signal made up of a small number of bits, such as one bit, can be processed in the amplitude direction. Thus it becomes possible to exploit the broad transmission range and the high dynamic range proper of a small-number bit digital signal in order to realize transmission of high-quality audio signals.

With the digital signal processing apparatus according to the present invention, since the calculating process performs processing operations on input signals made up of a small number of bits, by controlling the multi-bit signals, responsive to the input digital signal made up of the small number of bits, while the bit number conversion process converts the output signal of the calculating process into a signal of a smaller number of bits, the digital signal made up of a small number of bits, such as one bit, can be processed in the amplitude direction. Thus it becomes possible to exploit the broad transmission range and the high dynamic range proper of a small-number bit digital signal in order to realize transmission of high-quality audio signals.

DESCRIPTION OF THE PREFERRED EMBODIMENTS

Figure 1:
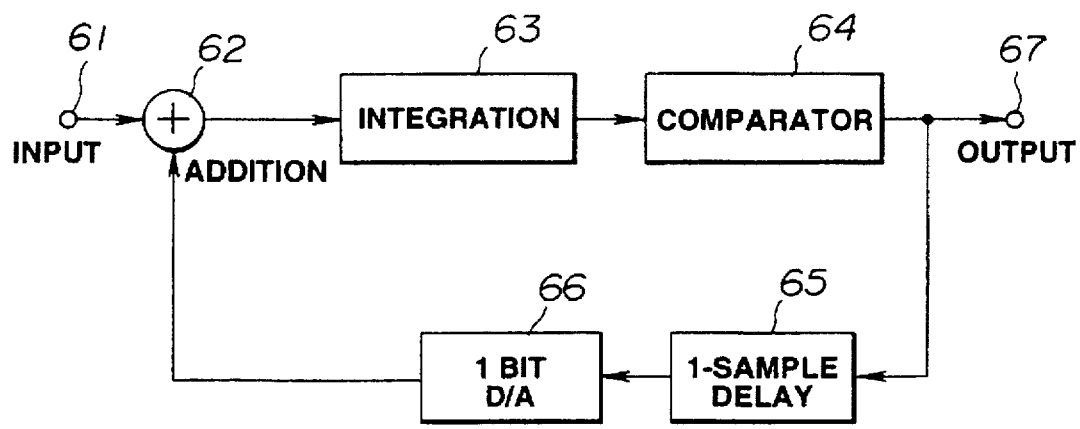
FIG. 1 schematically shows a $\Sigma\Delta$ modulation circuit.
Figure 2:
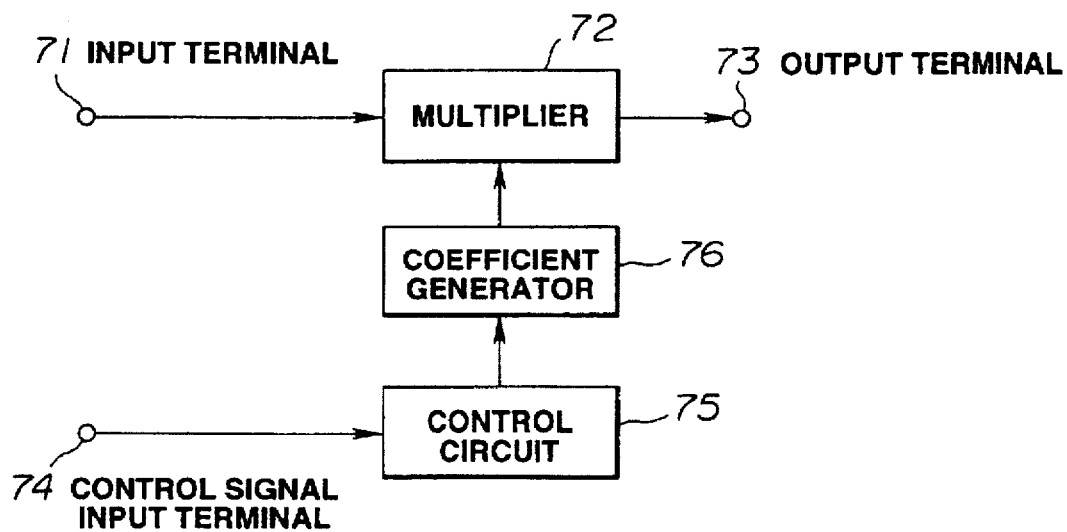
FIG. 2 schematically shows the control along the amplitude direction of a conventional multi-bit digital signal processing circuit.

Referring to the drawings, illustrative embodiments of the digital signal processing method and apparatus according to the present invention will be explained in detail.

The first embodiment of the present invention is directed to a digital signal processing apparatus preferably applied to a digital audio recording/reproducing apparatus for $\Sigma\Delta$ modulation of an input audio signal to form a one-bit digital signal or one-bit digital data for recording on a recording medium, such as a magnetic tape, and for reproducing and outputting the one-bit digital data from the recording medium. The digital signal processing apparatus is capable of performing signal processing in the amplitude direction, such as equalizing, filtering or fading, as a sort of attenuation, on the one-bit digital data. The signal process in the amplitude direction is a processing of increasing or decreasing amplitude components of the one-bit digital data along the time axis.

Figure 3:
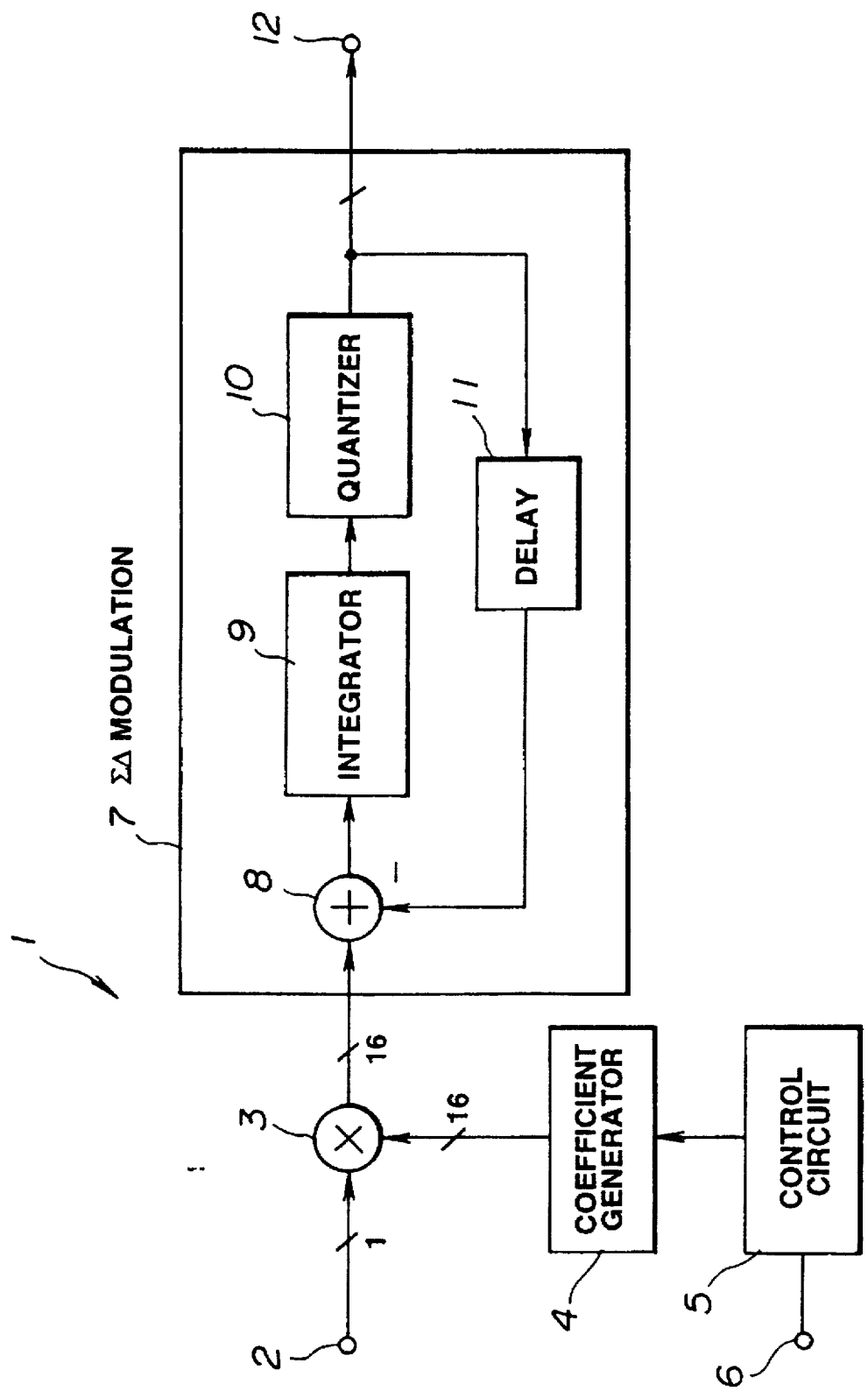
FIG. 3 is a block diagram showing a digital signal processing circuit for controlling a one-bit digital signal in the amplitude direction according to the present invention.

Referring to FIG. 3, the digital signal processing apparatus 1 includes a multiplier 3, as an arithmetic unit for performing an arithmetic operation on the $\Sigma\Delta$ modulated one-bit digital data from an input terminal 2 by controlling a multi-bit signal in accordance with the one-bit digital data, and a $\Sigma\Delta$ modulation unit 7 as a minor number bit conversion means for re-converting an output of the multiplier 3 into a one-bit digital data.

The multiplier 3 is a coefficient multiplication means responsive to the one-bit digital data to multiply the one-bit digital data with a multi-bit multiplication coefficient, for example, a 16-bit multiplication coefficient, generated in a coefficient generator 4.

The coefficient generator 4 is responsive to a command signal, as later explained, supplied to a control circuit 5, to generate the 16-bit multiplication coefficient. To a control signal input terminal 6, connected to the control circuit 5, is supplied command signal for executing the signal processing in the amplitude direction, such as fading, as selected by the user. The control circuit 5 is responsive to the command signal of executing the fading for controlling the coefficient generator 4 to generate the multi-bit multiplication coefficient.

The multiplier 3 outputs the result of the multiplication, that is a multi-bit digital data, to an adder 8 as a part of the ΣΔ modulation unit 7. The ΣΔ modulation unit 7 includes, in addition to the adder 8, an integrator 9 for integrating an addition output of the adder 8, a quantizer 10 for quantizing data from the integrator 9 into one-bit digital data every sampling period and a delay unit 11 for delaying an output of the quantizer 10 by a delay time equal to a sampling period. A quantized output of the quantizer 10 is negatively fed back via delay unit 11 to the adder 8 so as to be subtractively added to the multiplication output of the multiplier 3. The one-bit digital data, as quantized output of the quantizer 10, is outputted at an output terminal 12.

Figure 4:
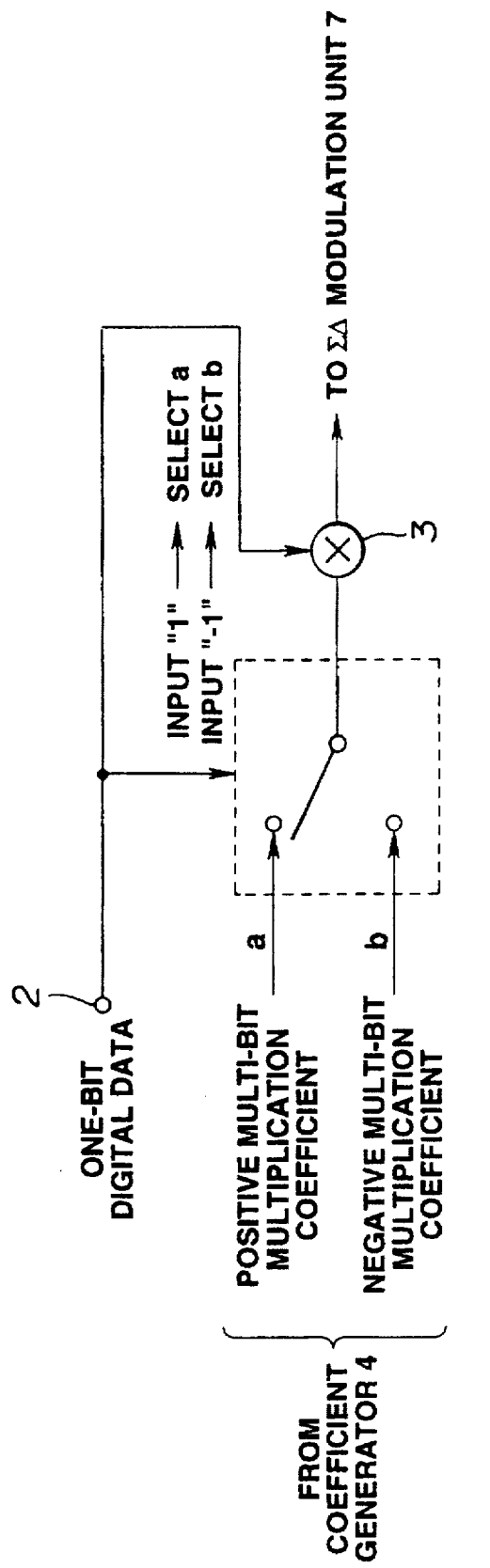
FIG. 4 shows a first embodiment illustrating a specific arrangement of controlling the one-bit digital signal in the amplitude direction.

The digital signal processing apparatus 1 operates as follows:

The one-bit digital data is supplied via input terminal 2 to the multiplier 3 which then is responsive to the binary state of the one-bit digital data, that is to whether the data is "1" or "−1", to multiply the one-bit digital data with a positive or negative multi-bit, herein 16 bit, multiplication coefficient, respectively, as shown in FIG. 4. That is, the positive or negative multi-bit coefficient, generated by the coefficient generator 4 based upon the command signal supplied to the control circuit 5, is selected depending upon the binary state of the one-bit digital data so as to be multiplied with the one-bit digital data. A multi-bit multiplication output of the multiplier 3 is supplied to the ΣΔ modulation unit 7.

Figure 5:
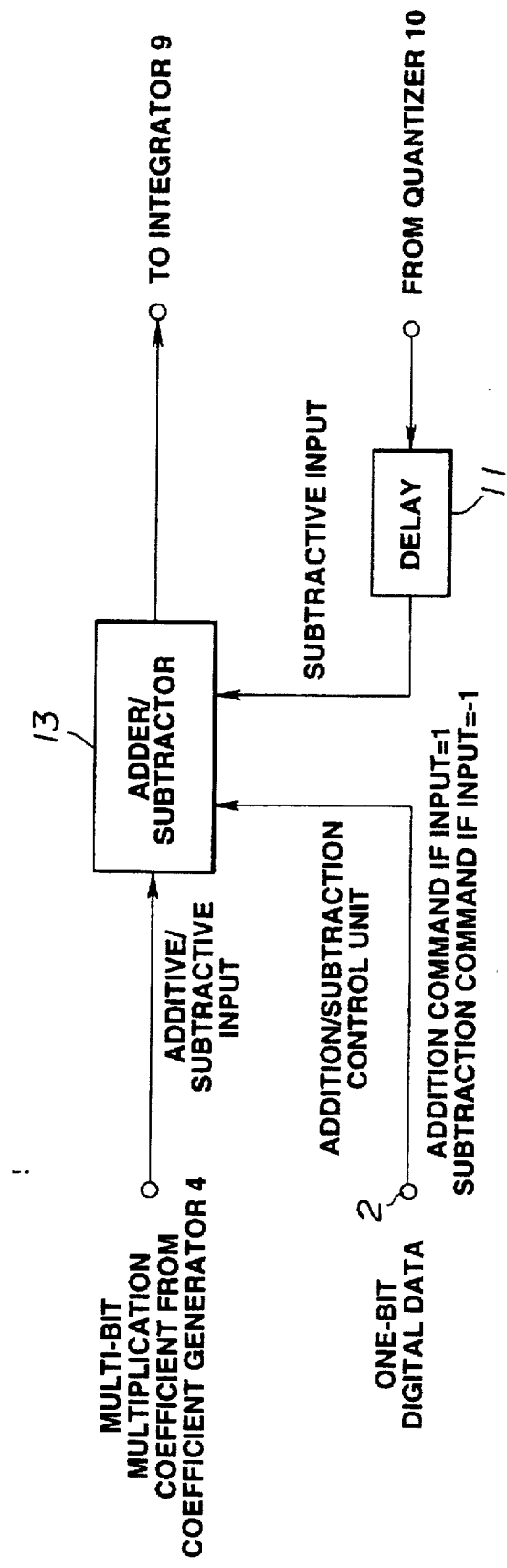
FIG. 5 shows a second embodiment illustrating a specific arrangement of controlling the one-bit digital signal in the amplitude direction.

An adder/subtractor 13 shown in FIG. 5 may be substituted for the multiplier 3. The adder/subtractor 13 is responsive to the binary state of the one-bit digital data, that is to whether the one-bit digital data is "1" or "−1", to add or subtract the multi-bit multiplication coefficient outputted by the coefficient generator 4 to or from the delayed output of the delay unit 11, respectively. This substitution becomes possible since the one-bit digital data supplied from the input terminal is "1" or "−1", that is it has an absolute value equal to unity. The adder/subtractor 13 may be realized by unifying the multiplier 3 and the adder 8 of the ΣΔ modulation unit 7.

The downstream side circuit, fed with the multi-bit multiplication output, differs in structure depending upon which of the structures shown in FIGS. 4 and 5 is assumed by the multiplier 3. If the multiplier 3 operates as shown in FIG. 4, the multi-bit multiplication output is supplied as described above to the adder 8 where a negative delay output of the delay unit 11 is added to the multi-bit multiplication output. If the multiplier 3 is replaced as shown in FIG. 5, the multi-bit multiplication output is supplied as described above to the integrator 9.

If the multiplier 3 is configured as shown in FIG. 4, the multi-bit multiplication output, from which the delay output is subtracted by the adder 8 as described above, is integrated by the integrator 9 and quantized by the quantizer 10 with a period equal to a sampling period so as to be re-converted into one-bit digital data which is outputted at the output terminal 12.

The signal processing performed by the multiplier 3 on the one-bit digital data is the signal processing along the amplitude direction, such as equalizing or fading, which is a sort of attenuation, as previously explained. For simplification, the processing performed by the multiplier 3 will now be explained as being a signal processing for reducing the input signal amplitude by one half.

Figure 6A:
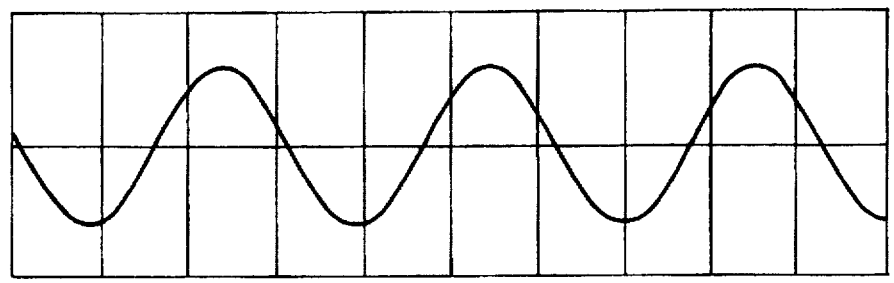
FIGS. 6A and 6B show signal waveforms before and after amplitude processing, respectively.
Figure 6B:
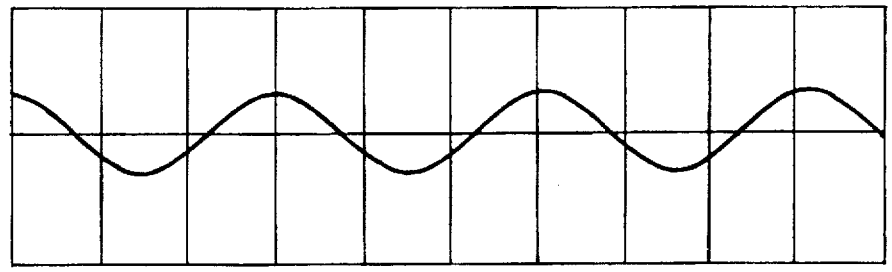

Referring to FIGS. 6A and 6B, the result of the processing of the digital signal processing apparatus 1 in the case where the multiplier 3 performs an operation of reducing the input signal amplitude by one-half, is explained. FIG. 6A shows a signal waveform in the case where the one-bit digital data supplied to the input terminal 2 of FIG. 3 is re-converted into the analog signal by being passed through an analog low-pass filter. FIG. 6B shows a signal waveform in the case where the one-bit digital data, obtained by the signal processing performed by the digital signal processing apparatus 1 shown in FIG. 3, is re-converted into the analog form. Although the input/output bit length is one bit for both data, the two data differ significantly in pattern. That is, the analog audio signal obtained by being passed through the analog filter of a simple design has its amplitude reduced by one-half.

With the digital signal processing apparatus 1, described above, the multiplier performs its operation as it controls the multi-bit multiplication coefficient generated by the coefficient generator 4 responsive to the type of processing, that is attenuation or mixing, in dependence upon the binary state of the one-bit digital data as the minor-number bit input digital signal. The multi-bit multiplication output of the multiplier 3 is re-converted by the ΣΔ modulation unit 7 into the small-number bit digital signal, herein the one-bit digital data. Thus it becomes possible to exploit the broad transmission range and the high dynamic range proper to the small-number bit digital signal in order to realize transmission of high-quality audio signals.

Figure 7:
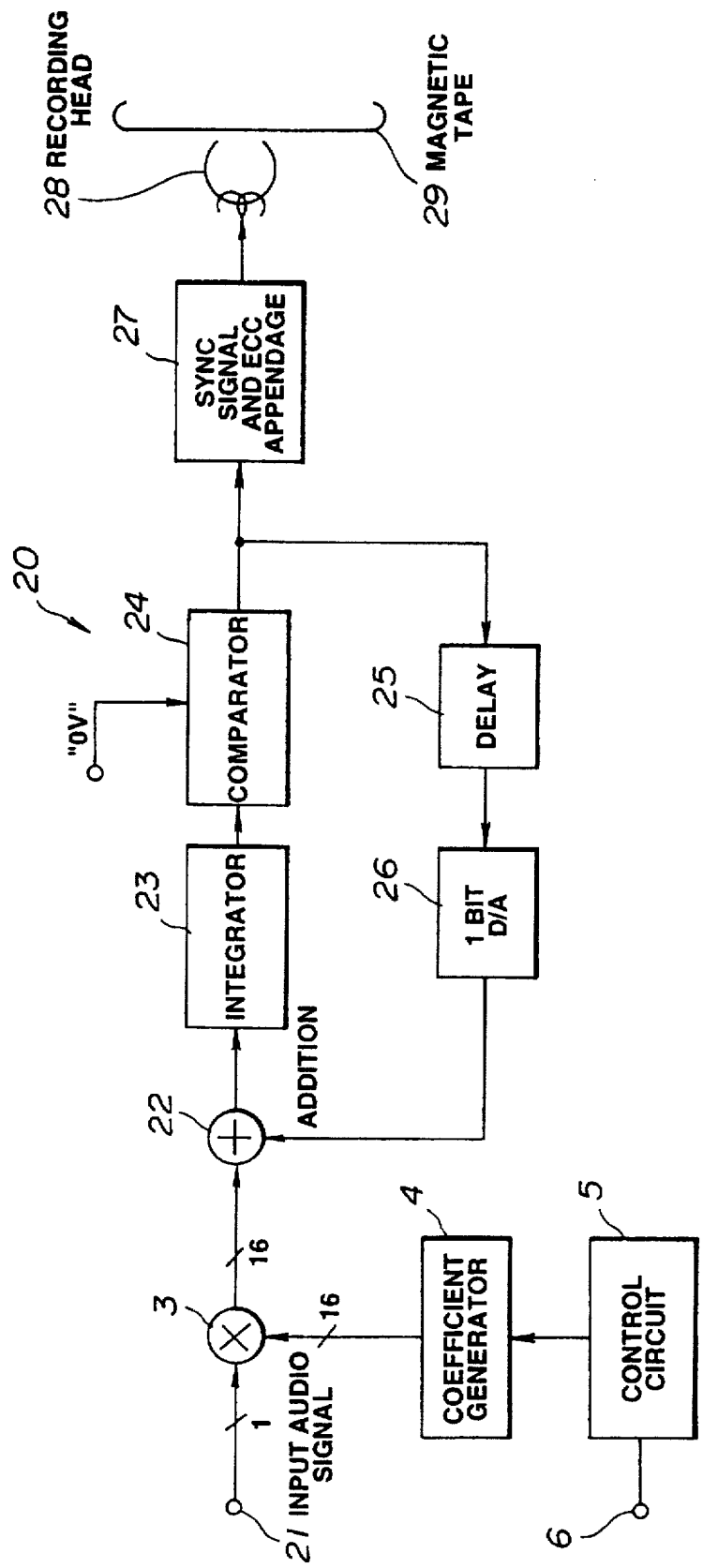
FIG. 7 is a block diagram illustrating a recording apparatus according to the present invention.
Figure 8:
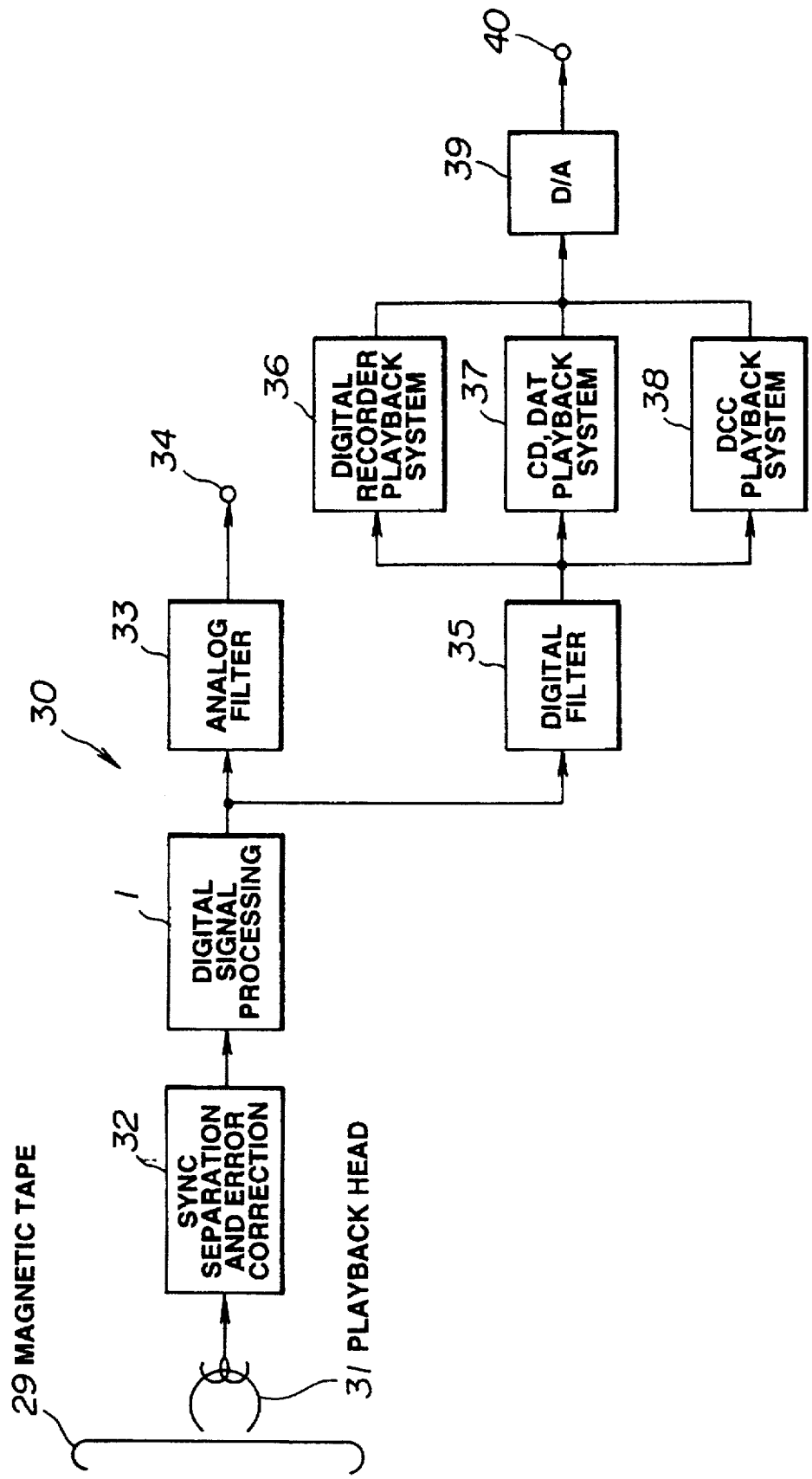
FIG. 8 is a block diagram illustrating a reproducing apparatus according to the present invention.

The digital signal processing apparatus 1 is applied to a digital audio recording/reproducing apparatus including a recording unit 20, shown in FIG. 7, and a reproducing unit shown in FIG. 8. The recording unit 20 ΣΔ modulates the input audio signal to form one-bit digital data and appends a synchronization signal and an error correction code, at an interval of a pre-set number of bits as a unit, for effecting the recording, while the reproducing unit 30 reproduces the one-bit digital data recorded by the recording unit 20 on a magnetic tape 29 (also shown in FIG. 7) and ultimately outputs the reproduced data as analog audio data. Although the digital signal processing apparatus 1 is provided within the reproducing unit 30, the recording unit 20 is first explained for convenience in explanation.

Referring to FIG. 7, an input audio signal from an input terminal 21 is multiplied by the multiplier 3 with a multi-bit multiplication coefficient from the coefficient generator 4. The coefficient, generated by the coefficient generator 4, is supplied to an integrator 23 via an adder 22 controlled by the controlling circuit 5. An output signal of the integrator 23 is supplied to a comparator 24 where it is compared to, for example, a neutral point potential ("0 V") of the input audio signal so as to be quantized by one-bit quantization every sampling period. The frequency of the sampling period, that is the sampling frequency, is set to a higher frequency equal to 64 or 128 times the sampling frequency of 48 kHz or 44.1 kHz conventionally employed.

The quantized data is supplied to a one-sample delay unit 25 where it is delayed by one sample period. The delayed data is supplied via a one-bit digital/analog (D/A converter) 26 to the adder 22 where it is added to the input audio signal from the input terminal 21. Thus the comparator 24 outputs quantized data which is the $\Sigma\Delta$ modulated input audio signal. The output quantized data of the comparator 24 is supplied to an appending circuit for appending the synchronization signal and the error correction coding (ECC) so that the synchronization signal and the error correction coding (ECC) are appended to the quantized data every pre-set number of samples.

Figure 9:
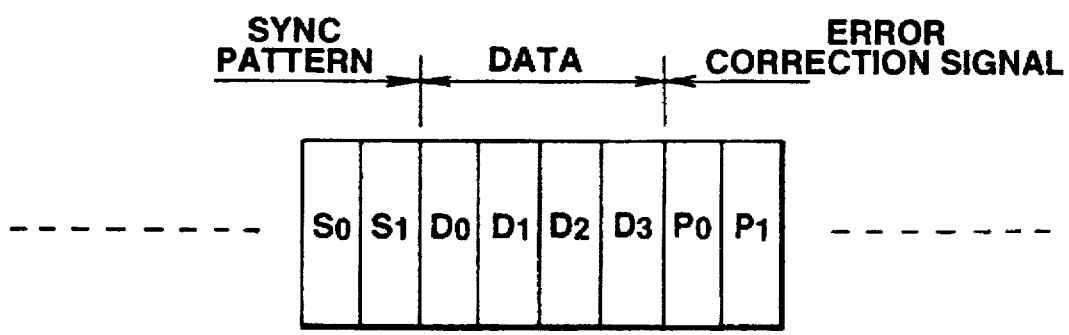
FIG. 9 shows a structure of data recorded or to be recorded on a recording medium of the present invention.

With this recording format, one-bit digital data, as the one-bit quantized data, are split every group of four one-bit data, such as in terms of data $D_0$ to $D_3$, as a unit, as shown in FIG. 9, and a set of synchronization signals $S_0$, $S_1$ and a set of error correction codes $P_0$, $P_1$ are appended to every group of four one-bit digital data. Transmission errors generated during recording/reproduction may be detected and corrected by the error correction codes $P_0$, $P_1$ appended by the synchronization signals and error correction code appending circuit 27.

In the reproducing unit 30, shown in FIG. 8, the one-bit digital data recorded by the reproducing playback head 31 on the magnetic tape 29 is reproduced by a reproducing playback head 31. Since the one-bit digital data is recorded by a standard format in which the synchronization signals and the error correction codes are appended to every group of four one-bit digital data, the one-bit digital data when supplied to a synchronization signal separating and error correction circuit 32 is freed of the synchronization signals and corrected for errors so that only the one-bit digital data generated by $\Sigma\Delta$ modulation of the input audio signal is generated. The one-bit digital data, thus generated, is supplied to the digital signal processing apparatus 1 shown in detail in FIG. 3.

The one-bit digital data is controlled by the digital signal processing apparatus 1 in the amplitude direction, as explained previously. The one-bit digital data, thus processed by the digital signal processing apparatus 1, is restored by the analog filter 33 into analog audio signals, which are outputted at a monitoring terminal 34.

The $\Sigma\Delta$ re-modulated one-bit digital data, outputted by the digital signal processing apparatus 1, is converted by a digital filter 35, which is a decimation filter, into data of an optional signal format, such as a CD or DAT format. The digital signals, converted into the optional format, are supplied to an ordinary D/A converter 39 via a reproducing system 36 of a digital recorder of an optional format, a reproducing system 37 for a CD or DAT, or a reproducing system 38 for DCC (digital compact cassette). An analog audio signal is outputted at an output terminal 40.

Thus, with the digital audio recording/reproducing apparatus, employing the digital signal processing apparatus 1 of the instant embodiment, it becomes possible to exploit the broad transmission range and the high dynamic range proper of a small-number bit digital signal for realization of transmission of high-quality audio signals.

Figure 10:
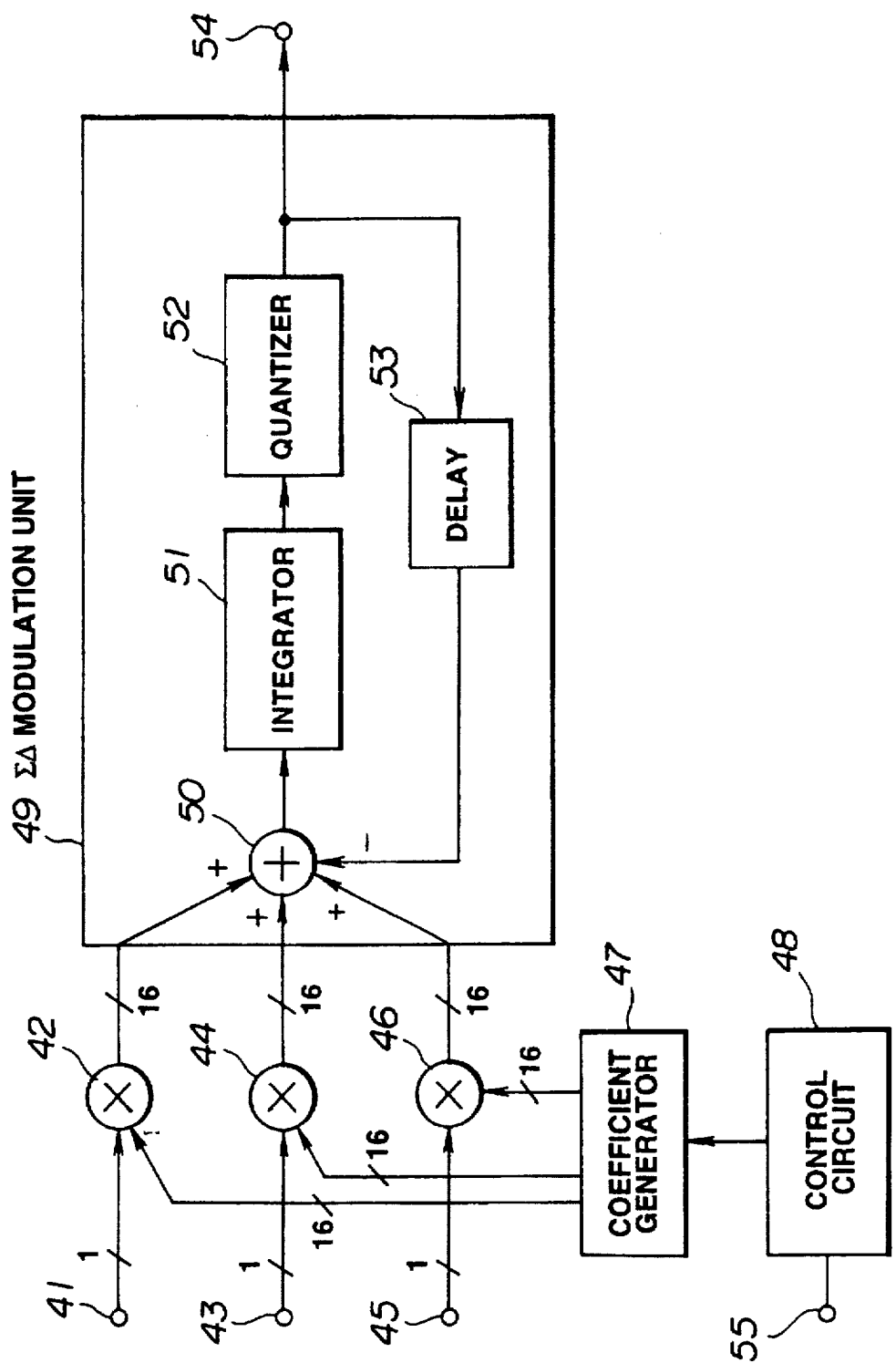
FIG. 10 illustrates a third embodiment of the digital signal processing circuit as a multi-mixer.

The digital signal processing method and apparatus according to the present invention is not limited to the above-described embodiment. For example, the digital signal processing apparatus may be configured for handling plural one-bit digital data, as shown in FIG. 10. This digital signal processing apparatus is now explained as a modified embodiment. It is possible with this modified embodiment to mix two or more channels of one-bit digital data, for example, three channels of one-bit digital data, at an optional mixing ratio to output a sole one-bit digital data.

To input terminals 41, 43 and 45 of the present modified embodiment are routed respective $\Sigma\Delta$ modulated one-bit digital data. The one-bit digital data supplied to the input terminal 41 enters a multiplier 42 which then multiplies the one-bit digital data with a multi-bit, for example, 16-bit, multiplication coefficient generated by a coefficient generator 47. The multi-bit multiplication coefficient is selectively controlled depending upon the binary state assumed by the one-bit digital data, as in an embodiment hereinafter explained. The one-bit digital data supplied to the input terminal 43 enters a multiplier 44 which then multiplies the one-bit digital data with a multi-bit, for example, 16-bit, multiplication coefficient generated by the coefficient generator 47. The one-bit digital data supplied to the input terminal 45 enters a multiplier 46 which then multiplies the one-bit digital data with a multi-bit, for example, 16-bit, multiplication coefficient generated by the coefficient generator 47. The coefficient generator 47 is controlled by a control circuit 48 to generate the multi-bit, herein 16-bit, multiplication coefficient. To a control input terminal 55, connected to the control circuit 48, is supplied a signal conforming to the signal processing in the amplitude direction, for example, mixing, as selected by the user. The coefficient generator 47 then generates a multi-bit multiplication coefficient, under control of the control circuit 48, on the basis of the signal conforming to the mixing.

Multi-bit multiplication outputs from the multipliers 42, 44 and 46 are supplied to an adder 50 of the $\Sigma\Delta$ modulation unit 49. The $\Sigma\Delta$ modulation unit 49 has, in addition to the adder 50, an integrator 51 for integrating a sum output of the adder 50, a quantizer 52 for quantizing the one-bit signal from the integrator 51 every sample period and a delay unit 53 for delaying the output of the quantizer 52 by a time equal to one sample period. The quantized output of the quantizer 52 is negatively fed back via delay unit 53 to the adder 50 where it is negatively added to the sum output of the multi-bit multiplication outputs. The one-bit digital data, which is the quantized output of the quantizer 52, is outputted at an output terminal 54.

With the digital signal processing apparatus 1 of the present modified embodiment, respective plural one-bit digital data are multiplied with independent multi-bit multiplication coefficients, associated with the binary states of the respective one-bit digital data, by the multipliers 42, 44 and 46. The multi-bit multiplication outputs of the multipliers 42, 44 and 46 are summed by the adder 50 and thence transmitted through the $\Sigma\Delta$ modulation unit 49 so as to be re-converted into one one-bit digital data. The multi-bit multiplication coefficients, supplied to respective independent multipliers 42, 44 and 46, are generated and controlled by the control circuit 48. Thus it is possible with the present modification to re-output one-bit digital data obtained on mixing amplitude components of plural input signals at an optional ratio. If the present modification is applied to, for example, a digital audio transmission apparatus configured for transmitting and recording $\Sigma\Delta$ modulated one-bit digital data, it becomes possible to transmit and record audio signals obtained on mixing amplitude components of plural input signals at an optional ratio. The present modification is not limited to the above-described mixing. For example, cross-fading or other attenuation may also be achieved by controlling multi-bit multiplication coefficients and varying the contents of the arithmetic operations performed within the multipliers 42, 44 and 46.

What is claimed is:

1. A digital signal processing apparatus comprising:
   coefficient generating means for generating a multi-bit coefficient signal in response to an actuation by a user;
   processing means for performing a pre-set processing operation upon a bit-based input digital signal and said multi-bit coefficient signal generated by said coefficient generating means; and
   conversion means for re-quantizing a multi-bit signal outputted by said processing means.

2. The digital signal processing apparatus as claimed in claim 1 wherein said processing means comprises a multiplier for multiplying said bit-based input digital signal and said multi-bit coefficient signal generated by said coefficient generating means.

3. The digital signal processing apparatus as claimed in claim 2 further comprising selecting means for selecting said multi-bit coefficient signal for processing by said processing means depending upon said bit-based input digital signal.

4. The digital signal processing apparatus as claimed in claim 1 wherein said conversion means comprises a sigma-delta modulation circuit.

5. The digital signal processing apparatus as claimed in claim 4 wherein said pre-set processing operation of said processing means is based upon a re-quantized input digital signal generated by said sigma-delta modulation circuit.

6. The digital signal processing apparatus as claimed in claim 1 wherein said processing means comprises an adder/subtractor, and further comprising selecting means for selecting, based upon said bit-based input digital signal, whether a requantized digital signal output from said conversion means and said multi-bit coefficient signal generated by said coefficient generating means are to be added or subtracted relative to each other.

7. A digital signal processing apparatus comprising:
   input means for inputting a plurality of one-bit digital signals;
   coefficient generating means for generating a plurality of pre-set coefficients formed by multiple bits, said plurality of pre-set coefficients being associated with said plurality of one-bit digital signals entering said input means;
   processing means for performing pre-set processing operations upon said plurality of one-bit digital signals entering said input means and said plurality of coefficients formed by multiple bits generated by said coefficient generating means;
   first addition means for adding results of said pre-set processing by said processing means;
   conversion means for re-quantizing an output of said addition means into a re-quantized one-bit digital signal; and
   second addition means for adding said output from said first addition means and said one-bit digital signal produced by said conversion means.

8. The digital signal processing apparatus as claimed in claim 7 wherein said processing means comprises a plurality of multipliers and wherein said one-bit input digital signal is multiplied with said plurality of pre-set coefficients made up of multi-bit signals generated by said coefficient generating means.

9. The digital signal processing apparatus as claimed in claim 8 further comprising selecting means for selecting said plurality of pre-set coefficients for processing by said processing means depending upon said plurality of one-bit digital signals.

10. The digital signal processing apparatus as claimed in claim 7 wherein said conversion means comprises a sigma-delta modulation circuit.

11. The digital signal processing apparatus as claimed in claim 10 wherein said re-quantized one-bit digital signal is generated by said sigma-delta modulation circuit.

12. The digital signal processing apparatus as claimed in claim 7 wherein said processing means comprises an adder/subtractor, and further comprising selecting means for selecting, based upon said plurality of one-bit digital signals, whether a requantized one-bit digital signal output from said conversion means and said multi-bit coefficient signal generated by said coefficient generating means are to be added or subtracted relative to each other.

13. A recording apparatus for recording a one-bit digital signal on a recording medium comprising:
   coefficient generating means for multi-bit coefficient signal in response to an actuation by a user;
   processing means for performing a pre-set processing operation upon a bit-based input digital signal and said multi-bit coefficient signal generated by said coefficient generating means; and
   conversion means for re-quantizing a multi-bit signal outputted by said processing means into a re-quantized one-bit digital signal; and
   recording means for recording said re-quantized one-bit digital signal re-quantized by said conversion means on a recording medium.

14. A reproducing apparatus for reproducing a one-bit digital signal from a recording medium comprising:
   coefficient generating means for generating a multi-bit coefficient signal in response to an actuation by a user;
   processing means for performing a plurality of pre-set processing operations upon a coefficient made up of a one-bit digital signal reproduced from said recording medium and said multi-bit coefficient signal generated by said coefficient generating means;
   conversion means for re-quantizing a multi-bit signal outputted by said processing means into a re-quantized one-bit digital signal; and
   output means for converting said re-quantized one-bit digital signal re-quantized by said processing means into an analog signal and outputting said produced analog signal.

15. A reproducing apparatus for reproducing a one-bit digital signal from a recording medium comprising:
   coefficient generating means for generating a multi-bit coefficient signal in response to an actuation by a user;
   processing means for performing a plurality of pre-set processing operations upon an input bit-based digital signal, having a number of bits smaller than a number of the bits of said multi-bit coefficient signal, and said multi-bit coefficient signal generated by said coefficient generating means; and
   conversion means for re-quantizing a multi-bit signal outputted by said processing means into a smaller-number bit digital signal.

* * * * *